United States Patent
Roohparvar

(10) Patent No.: US 6,381,193 B1
(45) Date of Patent: Apr. 30, 2002

(54) APPARATUS FOR EXTERNALLY TIMING HIGH VOLTAGE CYCLES OF NON-VOLATILE MEMORY SYSTEM

(75) Inventor: Frankie F. Roohparvar, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/521,158

(22) Filed: Mar. 8, 2000

Related U.S. Application Data

(62) Division of application No. 09/304,360, filed on May 4, 1999, which is a continuation of application No. 08/867,527, filed on Jun. 2, 1997, which is a continuation of application No. 08/567,623, filed on Dec. 5, 1995, now Pat. No. 5,636,166.

(51) Int. Cl.[7] ................................................. G11C 8/00
(52) U.S. Cl. ........................ 365/233; 365/236; 365/191; 365/194; 365/193
(58) Field of Search ................................. 365/233, 194, 365/193, 191, 236; 327/166, 175

(56) References Cited

U.S. PATENT DOCUMENTS

| | | | |
|---|---|---|---|
| 5,297,096 A | 3/1994 | Terada et al. | 365/218 |
| 5,345,418 A | 9/1994 | Challa | 365/185 |
| 5,347,490 A | 9/1994 | Terada et al. | 365/219 |
| 5,467,309 A | * 11/1995 | Tanaka et al. | 365/185.14 |
| 5,511,022 A | 4/1996 | Tim et al. | 365/185.17 |
| 5,627,784 A | 5/1997 | Roohparvar | 365/189.01 |
| 5,636,166 A | * 6/1997 | Roohparvar | 365/194 |
| 5,732,036 A | * 3/1998 | Merritt et al. | 365/203 |
| 5,751,944 A | * 5/1998 | Roohparvar | 395/183.18 |
| 5,777,453 A | * 7/1998 | Imanaga | 320/22 |
| 5,801,985 A | 9/1998 | Roohparvar et al. | 365/185.01 |
| 5,880,996 A | 3/1999 | Roohparvar | 365/185.33 |
| 5,890,193 A | 3/1999 | Chevallier | 711/103 |
| 5,901,108 A | * 5/1999 | Roohparvar | 365/233 |
| 5,959,485 A | 9/1999 | Roohparvar | 327/227 |
| 6,049,241 A | * 4/2000 | Brown et el. | 327/295 |

* cited by examiner

Primary Examiner—Viet Q. Nguyen
(74) Attorney, Agent, or Firm—Schwegman, Lundberg, Woessner & Kluth, P.A.

(57) ABSTRACT

An apparatus which allows the pulse duration of the high voltage pulses used in the programming and erase operations of a non-volatile memory system to be determined by an external timing signal instead of the internal timer normally used. Control of the pulse duration by the internal timer is disabled by gating the timer output signal with the external signal in a manner such that the gate output signal (which triggers the end of the high voltage pulse) is only generated when the external timing signal has a predetermined value. By controlling the value of the external timing signal, the pulse duration can be varied and have values other than those which would result from use of the internal timer.

6 Claims, 8 Drawing Sheets

APPARATUS FOR EXTERNALLY TIMING HIGH VOLTAGE CYCLES OF NON-VOLATILE MEMORY SYSTEM

This application is a divisional of U.S. Ser. No. 09/304,360 filed May 4, 1999 which is a continuation of U.S. Ser. No. 08/867,527 filed Jun. 2, 1997 which is a continuation of U.S. Ser. No. 08/567,623 filed Dec. 5, 1995 which issued as U.S. Pat. No. 5,636,166 on Jun. 3, 1997.

TECHNICAL FIELD

The present invention relates to non-volatile memory systems, and more specifically, to an apparatus which allows external control of the timing of the high voltage cycles used for programming and erasing of the memory elements.

BACKGROUND OF THE INVENTION

The operation of many memory systems requires a substantial amount of processor overhead, and since different manufacturers require different operations for optimizing their particular memories, many such systems include an internal state machine (ISM) for controlling the operation of the memory system. The internal state machine controls the primary operations of the memory system, including reading, programming and erasing of the memory cells. Each of the primary operations is comprised of a large number of sub-operations which are necessary to carry out the primary operations, with these sub-operations also being controlled by the internal state machine.

FIG. 1 is a functional block diagram of a conventional non-volatile memory system 1. The core of memory system 1 is an array 12 of memory cells. The individual cells in array 12 (not shown) are arranged in rows and columns, with there being, for example, a total of 256K eight bit words in array 12. The individual memory cells are accessed by using an eighteen bit address A0–A17, which is input by means of address pins 13. Nine of the eighteen address bits are used by X decoder 14 to select the row of array 12 in which a desired memory cell is located and the remaining nine bits are used by Y decoder 16 to select the appropriate column of array 12 in which the desired cell is located. Sense amplifiers 50 are used to read the data contained in a memory cell during a read operation or during a data verification step in which the state of a cell is determined after a programming, pre-programming, or erase operation. The sense amplifier circuitry can be combined with the data compare and verify circuits used to compare the state of a cell to a desired state or to the input data used in programming the cell.

Programming or erasing of the memory cells in array 12 is carried out by applying the appropriate voltages to the source, drain, and control gate of a cell for an appropriate time period. This causes electrons to tunnel or be injected from a channel region to a floating gate. The amount of charge residing on the floating gate determines the voltage required on the control gate in order to cause the device to conduct current between the source and drain regions. This is termed the threshold voltage $V_{th}$ of the cell. Conduction represents an "on" or erased state of the device and corresponds to a logic value of one. An "off" or programmed state is one in which current is not conducted between the source and drain regions and corresponds to a logic value of zero. By setting the threshold voltage of the cell to an appropriate value, the cell can be made to either conduct or not conduct current for a given set of applied voltages. Thus, by determining whether a cell conducts current at a given set of applied voltages, the state of the cell (programmed or erased) can be found.

Memory system 1 contains an internal state machine (ISM) 20 which controls the data processing operations and sub-operations performed on the memory cells contained in memory array 12. These include the steps necessary for carrying out programming, reading and erasing operations on the memory cells of array 12. In addition, internal state machine 20 controls operations such as reading or clearing status register 26, identifying memory system 1 in response to an identification command, and suspending an erase operation. State machine 20 functions to reduce the overhead required of an external processor (not depicted) typically used in association with memory system 1.

For example, if memory cell array 12 is to be erased (typically, all cells or large blocks of cells are erased at the same time), the external processor causes the output enable pin $\overline{OE}$ to be inactive (high), and the chip enable $\overline{CE}$ and write enable $\overline{WE}$ pins to be active (low). The processor then issues an 8 bit command 20H (0010 0000) on data I/O pins 15 (DQ0–DQ7), typically called an Erase Setup command. This is followed by the issuance of a second eight bit command DOH (1101 0000), typically called an Erase Confirm command. Two separate commands are used to initiate the erase operation so as to minimize the possibility of inadvertently beginning an erase procedure.

The commands issued on I/O pins 15 are transferred to data input buffer 22 and then to command execution logic unit 24. Command execution logic unit 24 receives and interprets the commands used to instruct state machine 20 to initiate and control the steps required for erasing array 12 or carrying out another desired operation. If a programming operation is being executed, the data to be programmed into the memory cells is input using I/O pins 15, transferred to input buffer 22, and then placed in input data latch 30. The input data in latch 30 is then made available to sense amplifier circuitry 50 for the cell programming and data verification operations. Once a desired operation sequence is completed, state machine 20 updates 8 bit status register 26. The contents of status register 26 is transferred to data output buffer 28, which makes the contents available on data I/O pins 15 of memory system 1.

Memory system 1 verifies the status of the memory cells after performing programming or erasing operations on the cells. Verification occurs by accessing each memory element and evaluating the margins (the voltage differential between the threshold voltage of the memory cells and ground level) that the element has after the operation. The system then decides whether the element needs to be reprogrammed or erased further to achieve a desired operational margin.

The memory cells need to be programmed first in a pre-programming cycle before they can be erased. This is to avoid over-erasing the bits in some memory element to a negative threshold voltage, thereby rendering the memory inoperative. During this cycle of pre-programming, the memory system needs to check to see if the bits are programmed to a sufficient threshold voltage level. This is accomplished by a programming verification cycle that uses a different evaluation procedure than a regular read operation would use. After successful completion of the pre-programming cycle, a high voltage erase operation is executed. After the erase operation is completed, the memory system may go through an operation to tighten the distribution (reduce the variance) of memory element threshold voltages for ease of manufacturing. After this procedure, the memory system may perform a re-verify operation to determine if the data in the memory elements has remained undisturbed.

FIG. 2 is a state diagram showing the process flow (sub-operations) of a memory system of the type shown in FIG. 1 during the pre-programming, high voltage erase, and distribution adjustment stages of a complete erase operation. The complete erase operation starts with a pre-program cycle 200. This sub-operation programs all the elements in the memory array to a logic 0 value to make sure that the erase process starts from a known cell threshold voltage level. This part of the complete erase operation is used to reduce the possibility of over erasure of some of the memory elements during the later steps of the operation.

The pre-program cycle begins with an operation which increments the address of the memory cell which is to be pre-programmed 202. This is done because the pre-programming operation is executed on a cell by cell basis. This step is followed by a high voltage level set-up stage 204 which prepares the system for application of the high voltage levels (typically about 12 volts is applied to the gate of each memory cell and 5 volts to the drain) used for programming or erasing a memory cell. The high voltage level used for writing to (programming) the cell is then applied in stage 206.

The appropriate voltage levels for executing the data verification sequence (reading the data programmed in the cell and comparing it to a desired value) are applied to the appropriate circuitry at stage 208. This is followed by a program verification stage 210 which verifies that the programmed cell has a sufficient threshold voltage margin. This is typically accomplished by comparing the threshold voltage of the cell to a reference cell having a desired threshold voltage (corresponding to a logic value of 0). If the verification operation is not successful, steps 204, 206, 208, and 210 are repeated. Once the verification stage for a particular memory cell is successfully completed, it is followed by a program clean up stage 212.

Program clean up stage 212 conditions all internal nodes of the memory array to default values in order to prepare the memory system for the next operation. This concludes the pre-programming cycle for a given memory cell. The address of the cell to be operated on is then incremented at stage 202 and the process repeats itself until the last cell in a memory block to be erased is successfully pre-programmed. At this time, the incremented address will point to the first address location in the block, which is the first address for the next operation. When this occurs, all of the memory cells have been. pre-programmed and control is passed to the high voltage erase cycle 220.

In the high voltage erase cycle, the memory system performs a block erase operation on all of the cells contained in a block of memory. The first stage in the cycle is a high voltage level set-up stage 222 which prepares the memory block for application of the high voltage pulse(es) used for erasing the cells. This is followed by a high voltage stage 224 in which a short, high voltage pulse is applied to erase all of the memory cells in the block of cells. This is followed by a set-up verify stage 226 which applies the appropriate voltage levels for the data verification stage to the corresponding circuits. The next stage is an erase verify stage 228 which verifies that the erase operation was successfully carried out on each cell in the block. This is accomplished by accessing the cells, address by address, and comparing the threshold voltage of the cell to a reference cell having a desired threshold voltage level (corresponding to a logic value of 1).

If the erase operation was not successfully carried out (a cell was not erased to the threshold voltage margin corresponding to the desired logic value), control is passed back to the high voltage level set-up stage 222 and the high voltage cycle is carried out again to erase the entire block of cells. If the erase operation was successful for the cell under consideration, the address of the memory cell is incremented 230 and the next cell is tested for verification of the erase operation. Thus, if the maximum address of the cells in the block of memory has not been reached, erase verify stage 228 is carried out on the next memory cell in the block. If the maximum address for cells in the block has been reached (meaning that all the cells in the memory block have been successfully erased), control is passed to the distribution adjustment stage 240.

The distribution adjustment sub-operation 240 is used to tighten the distribution (reduce the variance) of the threshold voltages of the erased memory elements. This is done by applying high voltages (i.e., 12 volts) to the gates of all the memory cells in the memory block, with the memory cell drains floating and the sources at ground potential.

The distribution adjustment cycle begins with a high voltage set-up stage 242, which is followed by a high voltage stage 244 in which the voltages used to perform the adjustment sub-operation are applied. This is followed by set-up verification 246 stage which applies the appropriate voltage levels to the corresponding circuits, and erase verification 248 stage which acts to insure that all of the erased cells are still in an erased state. If the erase verification procedure fails, a final erase 249 stage may be executed. In the final erase stage, a short erase pulse is applied to the cells in the block. After completion of the previous steps, the memory elements are checked to determine if they still contain the appropriate data. At this point the erase operation is completed.

A programming operation is carried out by following a set of steps similar to those followed in pre-program stage 200 of FIG. 2. In particular, stages 204 through 212 of FIG. 2 describe the primary functions carried out in a regular programming operation. As a program operation is typically carried out on a specific memory cell, the increment; address state 202 used in the pre-program cycle to facilitate pre-programming of every cell in the memory array is not accessed. Another difference between the programming and pre-programming operations is that in a programming operation, program verify state 210 is designed to read the programmed data and compare it to input data obtained from input data latch 30, rather than to a logic value of 0, as in the pre-programming operation.

As noted in the discussions of the programming and erase operations, high voltage pulses are used to set the threshold voltage of the memory cells to a value corresponding to either a programmed (or pre-programmed) or erased state. Production of the high voltage pulses is controlled by state machine 20 which initiates the high voltage pulse cycle. A signal provided by state machine 20 acts to trigger an internal timer (typically contained in state machine 20) which outputs a control signal after a predetermined time period, thereby determining the pulse length. This process can be described with reference to FIG. 3, which is a block diagram of the components of memory system 1 responsible for internally determining the duration of the high voltage pulses used in a programming or erasing operation.

As shown in FIG. 3, a one-shot start high voltage cycle signal 302 provided by state machine 20 initiates the production of the high voltage pulse timing signal. Signal 302 is provided as an input to flip-flop 304 and acts to set the flip-flop. In the absence of a reset signal, flip-flop 304 produces an active high voltage signal 306 at its output which is applied to $V_{pp}$ switch (element 32 of FIG. 1) by state machine 20, where $V_{pp}$ switch acts to connect the appropriate internal nodes of memory system 1 to an external $V_{pp}$ voltage level used in the programming or erase operation. High voltage output signal 306 is also provided as an input to internal timer 308, which acts with one-shot 310 to determine the pulse length of active high voltage output signal 306.

High voltage signal 306 initiates a timing sequence performed by internal timer 308. Internal timer 308 is constructed so that when signal 306 is low, timer output signal 309 is low. When signal 306 goes high, timer output signal 309 goes high and stays at that level until timer 308 times out at the end of a predetermined time period which may be varied by means of control signals 311 provided to timer 308. When timer 308 times out, timer output signal 309 goes low. Thus, at the end of a time period corresponding to the intended pulse duration, timer output signal 309 transitions from high to low. A description of the design and operation of a timer circuit suited for use implementing internal timer 308 is found in U.S. patent application Ser. No. 08/509,035, filed Jul. 28, 1995, entitled "Adjustable Timer Circuit", the contents of which is hereby incorporated in full by reference.

The high to low transition of timer output signal 309 triggers one-shot 310 which produces a pulse 312 which acts to reset flip-flop 304. This causes active high voltage pulse signal 306 to be terminated. Thus, the time between the initiation of high voltage signal 306 and when timer output signal 309 transitions from high to low determines the pulse length of the high voltage pulse applied to the memory elements.

While this method of timing the duration of the high voltage pulses works well after testing of the memory cells of the memory system has been completed, it does not permit the pulse duration to be varied to the extent needed to fully characterize the memory cells. Varying the duration of the high voltage pulses causes the threshold voltages of the cells to shift, and can be used to evaluate the behavior of the memory cells during programming or erase operations. This can be of assistance to a test engineer who is investigating the operation and tolerances of the memory system.

What is desired is an apparatus which acts to disable internal timer control of the pulse length of the high voltage pulses used to program or erase the memory cells in a non-volatile memory system. It is also desired that the apparatus enable external control of the pulse length by means of user provided control signals.

SUMMARY OF THE INVENTION

The present invention is directed to an apparatus which allows the pulse duration of the high voltage pulses used in the programming and erase operations of a non-volatile memory system to be determined by an external timing signal instead of the internal timer normally used. Control of the pulse length by the internal timer is disabled by gating the timer output signal with the external signal in a manner such that the gate output signal (which triggers the end of the high voltage pulse) is only generated when the external timing signal has a predetermined value. By controlling the value of the external timing signal, the pulse duration can be varied and have values other than those which would result from use of the internal timer.

The ability to control the high voltage pulse duration by means of an external timing signal is accomplished by initiating a test mode of operation for the memory system, and then entering a specific code or sequence of codes which act to disable control of the pulse duration by the internal timer. A second code or sequence of codes from an external source is then used to terminate the high voltage pulse. This causes the duration of the high voltage pulse to be determined by the externally generated code signals rather than the internally generated timing signal. This allows a test engineer to determine the duration of the high voltage pulses used for the programming or erase operations.

Further objects and advantages of the present invention will become apparent from the following detailed description and accompanying drawings.

DETAILED DESCRIPTION OF THE INVENTION

Figure 3:
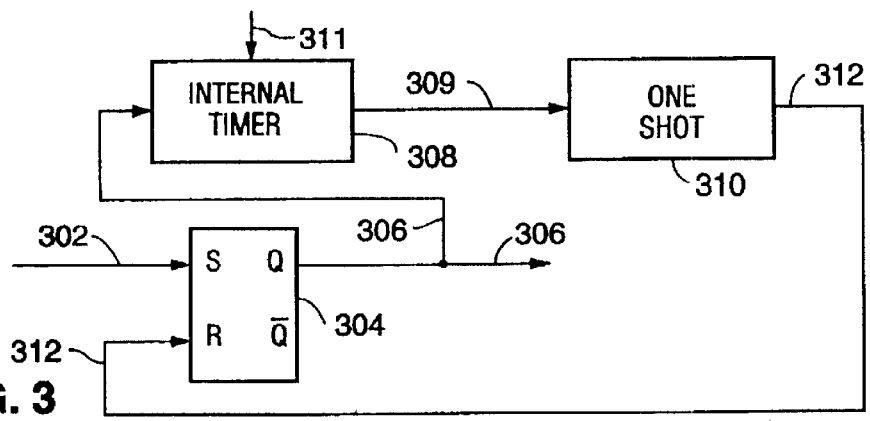
FIG. 3 is a block diagram of the components of the memory system of FIG. 1 responsible for internally determining the duration of the high voltage pulses used in a programming or erasing operation.
Figure 4:
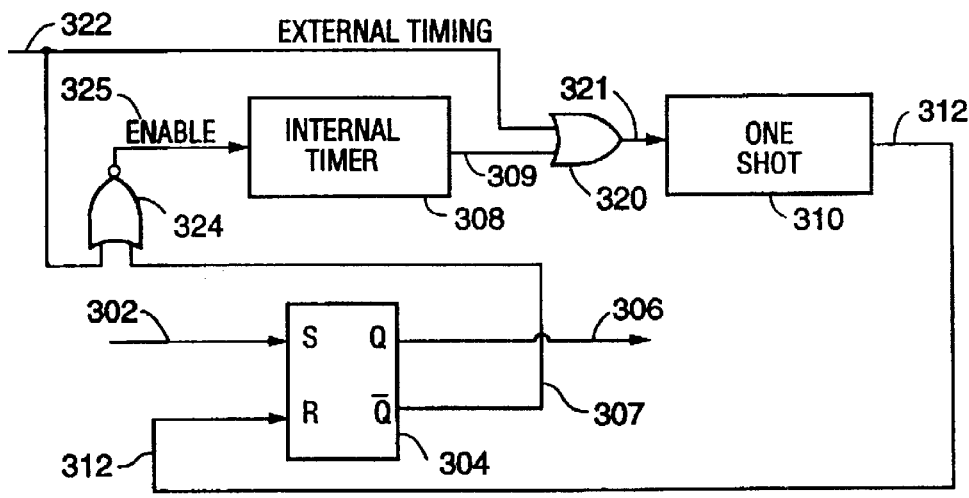
FIG. 4 is a block diagram of the components of the memory system of the present invention responsible for allowing external control of the duration of the high voltage pulses used in a programming or erasing operation.

FIG. 4 is a block diagram of the components of the memory system of the present invention responsible for allowing external control of the duration of the high voltage pulses used in a programming or erasing operation. It is noted that similar reference numbers in FIGS. 3 and 4 refer to the same signals and components in the two figures. Although the invention will be described with reference to a flash memory system, it is important to recognize that the present invention can be implemented as part of other types of memory systems. It is only necessary that the memory system in question be one wherein the duration of the voltage pulses used for programming and erase operations be determined by the operation of an internal timer.

As shown in FIG. 4, a one-shot start high voltage cycle signal 302 provided by state machine 20 initiates the production of the high voltage pulse. Signal 302 is provided as an input to flip-flop 304 and acts to set the flip-flop. In the absence of a reset signal, flip-flop 304 produces an active high voltage signal 306 at its output which is applied to $V_{pp}$ switch (element 32 of FIG. 8) by state machine 20, where $V_{pp}$ switch acts to connect the appropriate internal nodes of memory system 1 to an external $V_{pp}$ voltage level used in the programming or erase operation. The inverse output 307 of flip-flop 304 is provided as an input to two-input NOR gate 324. A second input to NOR gate 324 is an externally generated timing signal 322. The output of NOR gate 324 is an enable signal 325 for internal timer 308. When enable signal 325 is high, the timing sequence of timer 308 is initiated. Internal timer 308 is constructed so that when enable signal 325 is low, output signal 309 is low. When enable signal 325 goes high, output signal 309 goes high and stays at that level until the end of a predetermined period when the timer times out. At that time output signal 309 goes low. Thus, when timer 308 times out, output signal 309 transitions from high to low.

In accordance with the present invention, the production of high voltage signal 306 (and hence inverse output signal 307) is used in conjunction with NOR gate 324 and signal 322 to initiate the timing sequence performed by internal timer 308. When external timing signal 322 is low, gate 324 acts like an inverter on inverse output signal 307. When the high voltage pulse generation is initiated, high voltage signal 306 goes high and inverse signal 307 goes low. In this case timer enable signal 325 which is the output of NOR gate 324 is high. With enable signal 325 high, internal timer 308 begins its timing sequence and produces timer output signal 309 which stays high until the timer times out, when signal 309 transitions from high to low. Timer output signal 309 serves as one input to two-input OR gate 320. The second input to OR gate 320 is external timing signal 322. With signal 322 low, output signal 321 of OR gate 320 is high when timer output signal 309 is high and transitions to low when timer 308 times out.

When output signal 321 of gate 320 transitions from high to low, it triggers one-shot 310 which produces a pulse 312 which acts to reset flip-flop 304. This causes active high voltage pulse signal 306 to be terminated. Thus, with external timing signal 322 low, the circuit of FIG. 4 acts so that the pulse duration is determined by the operation of internal timer 308. The time between the initiation of high voltage signal 306 and the transition from a high to low value for internal timer output signal 309 determines the pulse length of the high voltage pulse applied to a memory element.

The other case to examine is when external timing signal 322 is high. Again, when the high voltage pulse generation is initiated, high voltage signal 306 goes high and inverse signal 307 goes low. With external timing signal 322 high and inverse signal 307 low, the output of NOR gate 324 is low. In this case timer enable signal 325 which is the output of NOR gate 324 is low. This means that the timing sequence of timer 308 is not initiated. Thus, by bringing external timing signal 322 high, control of the pulse duration by timer 308 is disabled. As a result of the timing sequence not being initiated, timer output signal 309 remains low. With external timing signal 322 high and timer output signal 309 low, output signal 321 of OR gate 320 is high. When external timing signal 322 is then brought low after a time period corresponding to the desired pulse duration, output signal 321 of OR gate 320 transitions from high to low. This triggers one-shot 310 which produces a pulse 312 which acts to reset flip-flop) 304. This causes active high voltage pulse signal 306 to be terminated.

Thus, by enabling a user of the present invention to determine when external timing signal 322 transitions from low to high, control of the pulse duration by timer 308 can be disabled. By enabling the user to then determine when external timing signal 322 transitions from high back to low, the duration of the high voltage pulse can be set to a desired value. As the value of timing signal 322 can be controlled externally, this permits external control of the pulse lengths of the high voltage pulses used in the programming or erase operations.

Figure 5:
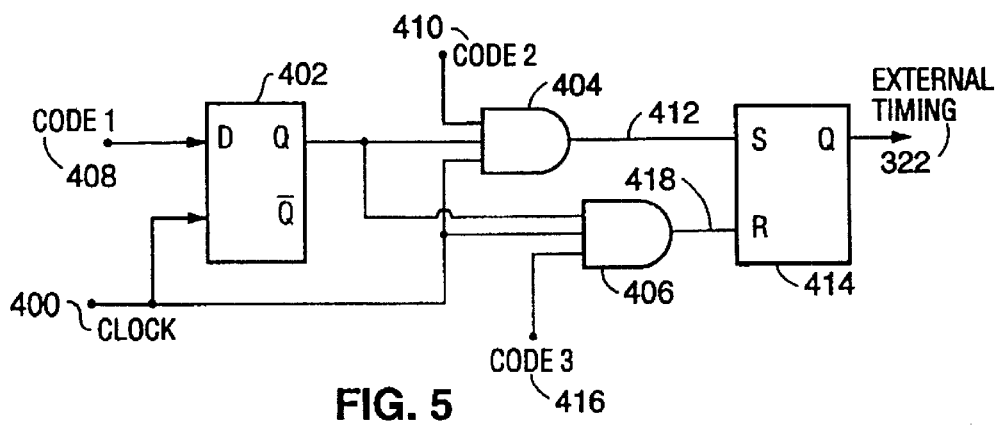
FIG. 5 is a schematic of the components responsible for generating the external timing signal used by the circuit of FIG. 4 to determine the duration of the high voltage pulses.

FIG. 5 is a schematic of the components responsible for generating external timing signal 322, which is used by the circuit of FIG. 4 to determine the duration of the high voltage pulses. As will be explained, a low to high transition of signal 322 is generated by the circuit of FIG. 5 in response to the issuance of a predetermined signal or signals (termed codes in the figure). As described previously, such a transition of external timing signal 322 acts to disable control of the pulse length by internal timer 308. After a desired period of time, a second set of code signals is entered which causes external timing signal 322 to transition from high to low, thereby terminating the high voltage pulse. By controlling the production of the code signals which cause signal 322 to go from low to high and back to low so that they are separated by a desired time interval, the duration of the high voltage pulses used for programming and erasing operations can be controlled externally instead of by the internal timer. Note that it is desirable to use more than one signal for these purposes to prevent the accidental disabling of the timer.

As shown in FIG. 5, a clock signal 400 is input to flip-flop 402. Clock signal 400 is also input to AND gates 404 and 406. A second input to data flip-flop 402 is a first signal 408 (termed code 1 in the figure) which is used to enable external control of the pulse duration. As clock signal 400 goes high during the first clock cycle, if code 1 signal 408 is present at the D input of data flip-flop 402, then when clock signal 400 goes low, the Q output of flip-flop 402 will go valid. The Q output of flip-flop 402 serves as a second input to three-input AN) gate 404. The third input to AND gate 404 is a second signal 410 (termed code 2 in the figure) which is used to enable the external timing operation. The output of AND gate 404 is output signal 412. Output signal 412 is input to flip-flop 414.

Since the Q output of flip-flop 402 was low prior to entering of code 1 signal 408, output 412 of AND gate 404 was low. The Q output of data flip-flop 402 is also provided as an input to AND gate 406. A third input (clock signal 400 is the second input) to gate 406 is a signal 416 (termed code 3 in the figure). Output signal 418 of AND gate 406 serves as the reset signal for flip-flop 414 and is low prior to entering code 1 signal 408 for the same reason that output 412 of AND gate 404 was low. With both signal 412 and signal 418 low, there will be no change to the state of flip-flop 414.

As clock signal 400 goes high during the second clock cycle, if code 2 signal 410 is entered so that now code 2 signal 410 is high while code 1 signal 408 and code 3 signal 416 are low, then output signal 412 of AND gate 404 will go high and set flip-flop 414. At the end of the clock cycle the Q output of data flip-flop 402 will go low since code 1 signal 408 was low during the cycle. In the absence of a reset signal, when signal 412 is high, the Q output of flip-flop 414 is valid. This Q output is signal 322, the external timing signal. By executing a sequence of code 1 signal 408 and code 2 signal 410 in consecutive clock cycles, external timing signal 322 is caused to transition from low to high, thereby disabling control of the high voltage pulse duration by internal timer 308.

At the end of the time period corresponding to the desired high voltage pulse duration, a similar sequence of two codes is entered to cause external timing signal to transition from high to low and terminate the pulse. Again code 1 signal 408 is entered during a first clock cycle. During the next clock cycle, code 3 signal 416 is entered. This will cause output signal 418 of AND gate 406 to go high, resetting flip-flop 414. This will bring the Q output of flip-flop 414 (external timing signal 322) low. By executing a sequence of code 1 signal 408 and code 3 signal 416 in consecutive clock cycles, external timing signal 322 is caused to transition from high to low. The high to low transition of timing signal 322 will act to terminate the high voltage pulse.

Figure 6:
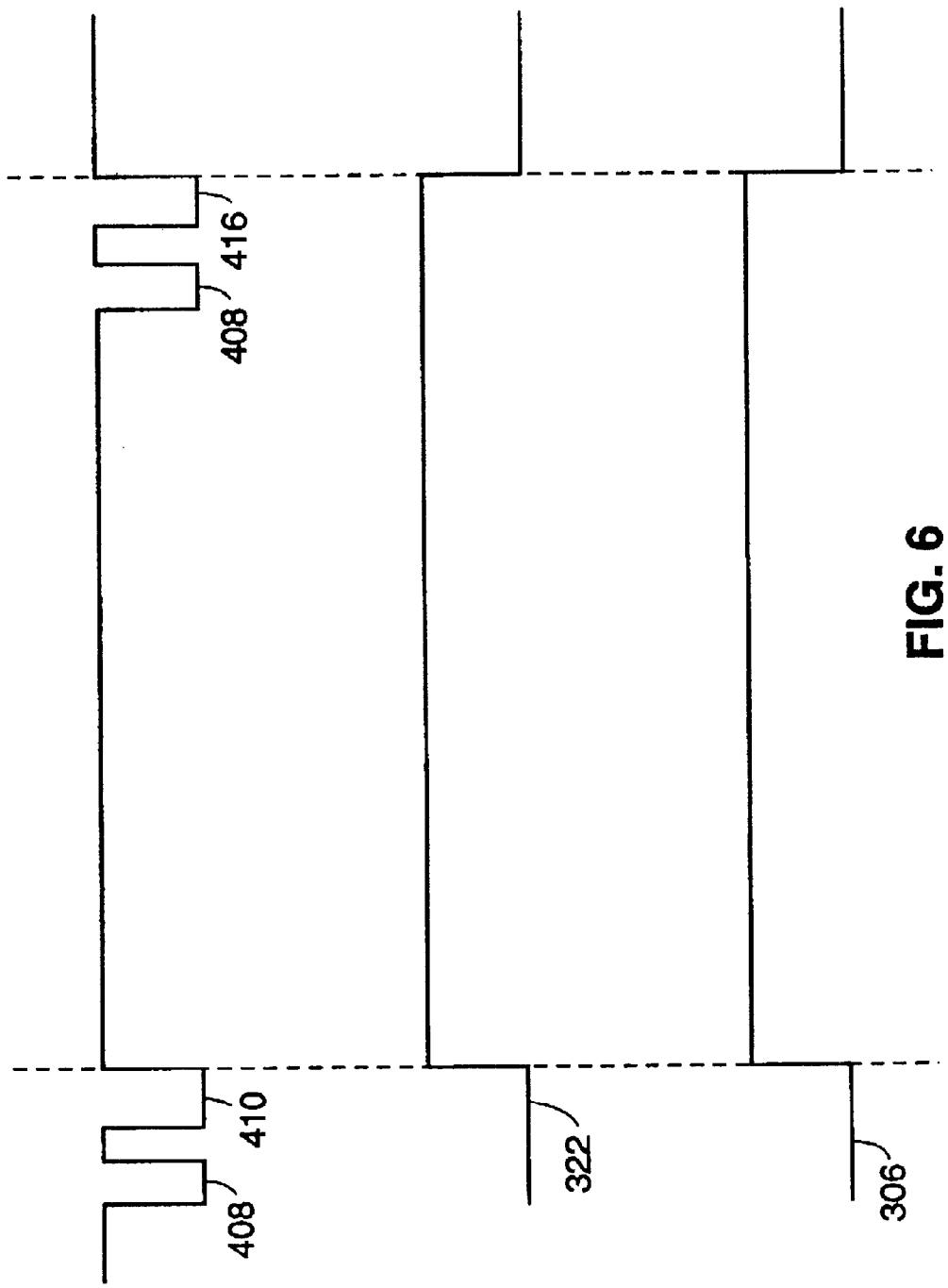
FIG. 6 is a timing diagram showing the relative timing of the signals used to provide external control of the duration of a high voltage pulse.

FIG. 6 is a timing diagram showing the relative timing of the signals used to provide external control of the duration of high voltage pulse 306.

As has been described, the present invention provides a means for disabling control of the high voltage pulse duration by the internal timer normally used and instead allows the pulse duration to be determined by externally generated signals. This is accomplished by generating a first set of control signals (or codes) which override internal timer control of the pulse duration and cause the high voltage pulse to be maintained at an active level until a second set of control signals (pulse termination signals) is received. This allows a test engineer or another user to control the pulse duration by spacing the first and second set of control signals by a desired time interval.

Figure 2:
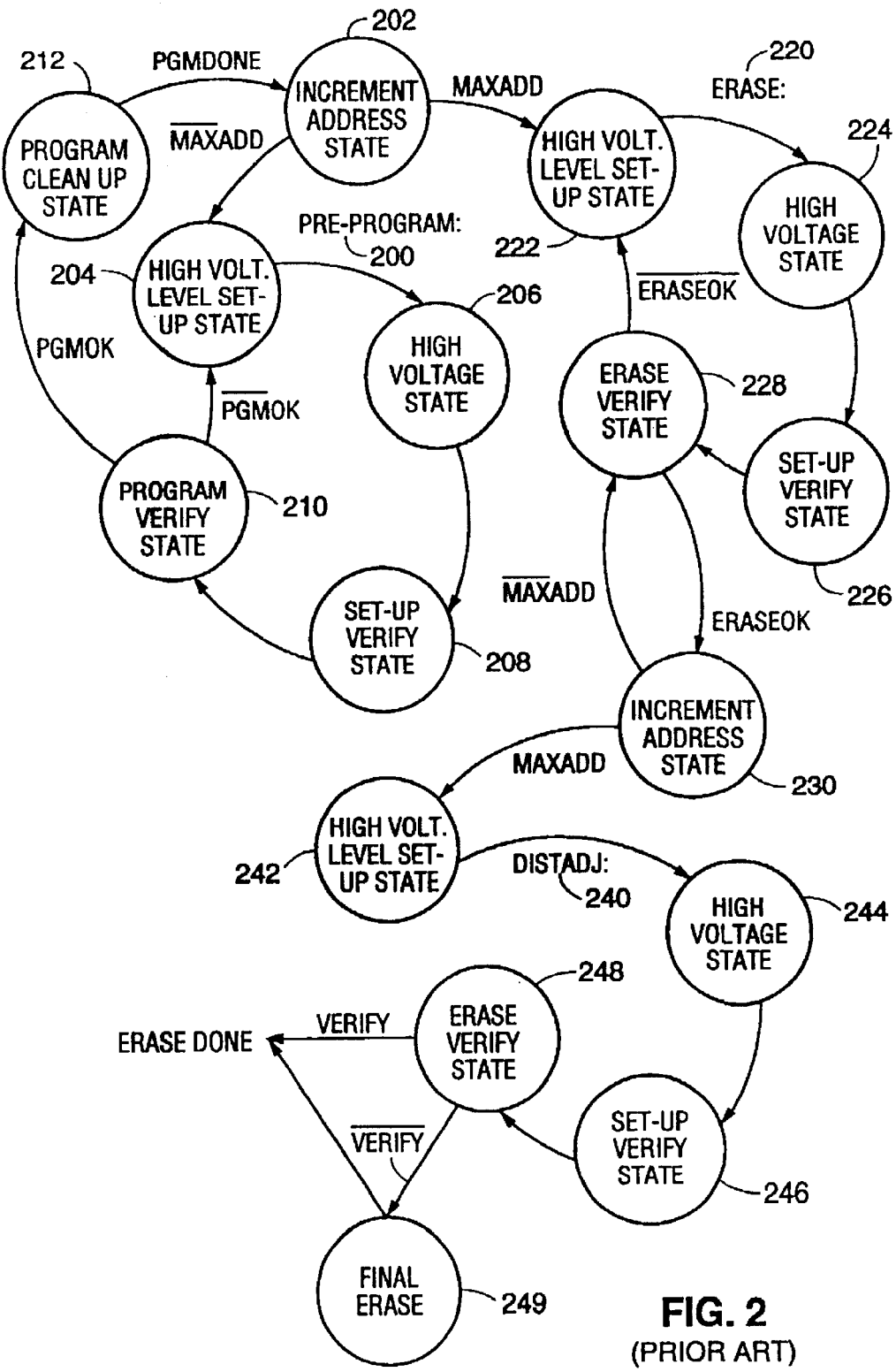
FIG. 2 is a state diagram showing the process flow (sub-operations) of a memory system of the type shown in FIG. 1 during the pre-programming, high voltage erase, and distribution adjustment stages of a complete erase operation.

If it is desired to examine the effect of a high voltage pulse of a desired duration on a memory cell or block of cells to the exclusion of other operations performed on those cells, then it is necessary to skip one or more of the stages of the pre-programming and erase operations shown in FIG. 2. For example, if one erase pulse is to be applied to a block of cells for an amount of time determined by an external processor (which would generate the sets of code signals described previously), then the stages of the erase cycle (220 in FIG. 2) other than high voltage set-up stage 222 and high voltage pulse stage 224 must be skipped or disabled. Similarly, if it is desired to apply a single programming pulse to a cell for an amount of time determined by an external processor, then the stages of the (pre-)programming cycle (200 in FIG. 2) other than high voltage set-up stage 204 and high voltage pulse stage 206 must be skipped or disabled. The combination of external control of the high voltage pulse duration and skipping of undesired stages of the programming or erasing operations permits a test engineer to determine how a high voltage pulse of desired length impacts the characteristics of the memory cells.

A method for initiating external control of the duration of the high voltage pulses and skipping certain stages of the pre-programming or erase operations is as follows:

1. place the memory system into a test or special mode of operation;
2. enter the code signals needed to disable control of the pulse duration by the internal timer;
3. enter control signals which will cause the appropriate stages of the programming or erase operation to be skipped (this may require re-entering the test mode);
4. execute the remaining (not skipped) high voltage pulse stage(s) for a desired period of time; and
5. enter the code signals needed to terminate the high voltage pulse and reenable control of the pulse length by the internal timer.

One method for placing the memory system into a test or special mode of operation is described in U.S. patent application Ser. No. 08/386,704, entitled, "Apparatus for Entering and Executing Test Mode Operations for Memory", filed Feb. 10, 1995, the contents of which is hereby incorporated in full by reference.

Figure 7:
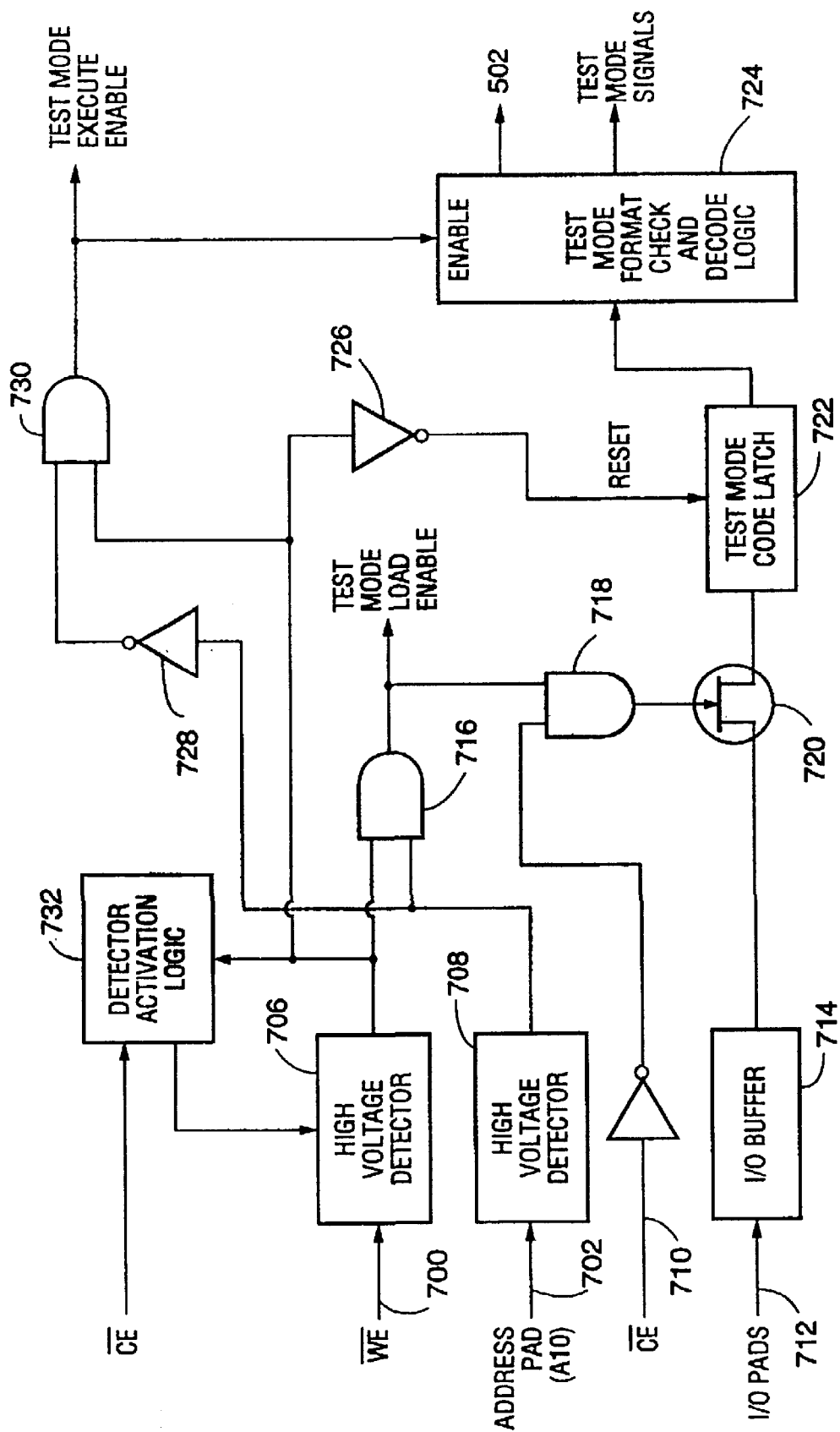
FIG. 7 is a schematic of a circuit for a detector/decoder which can be incorporated into a memory system and used for entering a test mode of operation in which the code signals used to control the duration of the high voltage pulses can be input.

FIG. 7 is a schematic of a circuit for a detector/decoder (see element 102 of FIG. 8) which can be incorporated into a memory system and used for entering a test mode of operation in which the code signals used to control the duration of the high voltage pulses can be input. In order to place the memory system into a mode of operation in which the duration of the high voltage pulses is externally controlled, the test mode must be entered and the appropriate test mode command signals (the codes for controlling the transitions of external timing signal 322) must be applied to the data I/O terminals of the memory.

Typically, the end user of the memory system would have no reason to cause the memory system to enter a test or special mode of operation since this mode is intended to be used by test engineers at the memory fabrication facility. Furthermore, accidental entry into such a mode is to be avoided since the memory could be rendered permanently inoperable in this mode. Thus, the test mode entry circuitry of FIG. 7 is designed to reduce the likelihood of accidental entry into the mode by requiring simultaneous application of high voltages to multiple memory system terminals.

The circuit of FIG. 7 is activated by application of a high voltage to two or more terminals 700 and 702 of the memory system from an external source. These terminals are non-dedicated terminals used during normal memory operations. Terminals 700 and 702 may include, for example, address terminal (pad) Alo and the write enable terminal $\overline{WE}$. The magnitude of the high voltage applied to terminals 700 and 702 is chosen to be outside of the range of voltages which would typically be applied to those terminals during use of the terminals in normal (non-test mode) operation of the memory system. This is done to prevent an end user from unintentionally entering the test or special mode. The high voltage applied to terminals 700 and 702 is detected by detectors 706 and 708. A detector circuit suited for use in constructing detectors 706 and 708 is described in U.S. patent application Ser. No. 08/493,162, entitled, "Integrated Circuit Having High Voltage Detection Circuit", filed Jun. 21, 1995, the contents of which is hereby incorporated in full by reference.

After application of the high voltage to terminals 700 and 702, a signal on another terminal 710, in this case the chip enable $\overline{CE}$ terminal, is made active (low). Code signal data corresponding to one of several possible test or special modes is placed on the data I/O terminals 712 of the memory system and forwarded to an I/O buffer 714. In the present case, code data corresponding to an external timing operation would be input. This could be the code signals previously described with reference to FIGS. 5 and 6, or another code indicative of an external timing operation which is followed by the code signals. Note that data I/O terminals 712 and I/O buffer 714 of FIG. 7 correspond, respectively, to data I/O pins 15 and input buffer 22 of FIG. 1.

An AND gate 716 provides a test mode load enable signal when the outputs of both high voltage detectors 706 and 708 indicate that an appropriate high voltage is being applied to terminals 700 and 702. The load enable signal is coupled to one input of an AND gate 718 together with an inverted signal $\overline{CE}$. This causes AND gate 718 to turn on pass transistor 720 which forwards the test or special mode code data entered by means of I/O pads 712 to buffer 714 and then to a test mode code latch 722. Separate I/O terminals and pass transistors 720 are used for each bit of input test or special mode data so that the data will be loaded into latch 722 in parallel. Typically there are a total of eight bits of test code data so that latch 722 will contain eight bits. Signal $\overline{CE}$ is then brought back to a high state, thereby latching the code data in latch 722.

After latch 722 has been loaded with the code data, one of the high input voltages, such as the input to address A10 terminal 702 is removed so that the output of detector 708 will go low thereby providing a high input to an AND gate 730 by way of inverter 728. Since the remaining input of gate 730, the output of the second high voltage detector 706, will still be high, gate 730 will produce a test or special mode enable signal. Among other things, this will enable a Test Mode and Format Check and Decode Logic unit 724 which will verify that the data in latch 722 corresponds to a proper test or special mode. In addition, unit 724 will decode the mode code to determine which one of approximately fifteen different special or test modes has been entered. These modes each have an associated mode signal which is produced by the Test Mode and Format Check and Decode Logic unit 724 and which is used by the memory system in combination with other signals for carrying out the various test or special mode functions.

The system will remain in the selected mode as long as the voltage applied to terminal 700 remains high. When signal $\overline{CE}$ is brought back to a high state, detector activation logic 732 keeps detector circuits 704 and 706 enabled as long as the voltage applied to terminal 700 remains high. During the course of carrying out the various test or special mode operations, it may be necessary to periodically change the state of the chip enable $\overline{CE}$ signal. However, since address A10 on line 702 has been shifted to a low state, the low output of AND gate 718 will prevent any change in the contents of mode code latch 722. Once the test or special mode of operation is completed, the high voltage applied to terminal 700 is removed, thereby causing the output of AND gate 730 to go low and end the test or special mode of operation.

The test mode codes loaded into latch 722 are preferably of a specific format which further reduces the possibility of accidental entry into a test mode. The mode code is typically divided into two groups of bits, with the first group of bits, the format bits, signifying a test or special mode of operation and the remaining bits signifying a particular one of the modes. A description of a code format suited for use with the present invention can be found in the previously mentioned U.S. patent application Ser. No. 08/386,704, entitled, "Apparatus for Entering and Executing Test Mode Operations for Memory".

With regards to the present invention, after placing the memory system into a test or special mode by using the appropriate type and sequence of high voltage signals, a user would enter code 1 signal 408 and code 2 signal 410 (see FIG. 5) as the special mode codes. As noted, these code signals are placed on the data I/O terminals 712 of the memory system. As discussed, entry of code 1 signal 408 and code 2 signal 410 in consecutive clock cycles will act to disable control of the high voltage pulse duration by the internal timer.

The next step is to disable or skip the appropriate stages of the pre-programming or erase cycles shown in FIG. 2. One method for performing this function is described in U.S. patent application Ser. No. 08/508,921, entitled "Memory System Having Programmable Flow Control Register", filed Jul. 28, 1995, the contents of which is hereby incorporated in full by reference.

Figure 8:
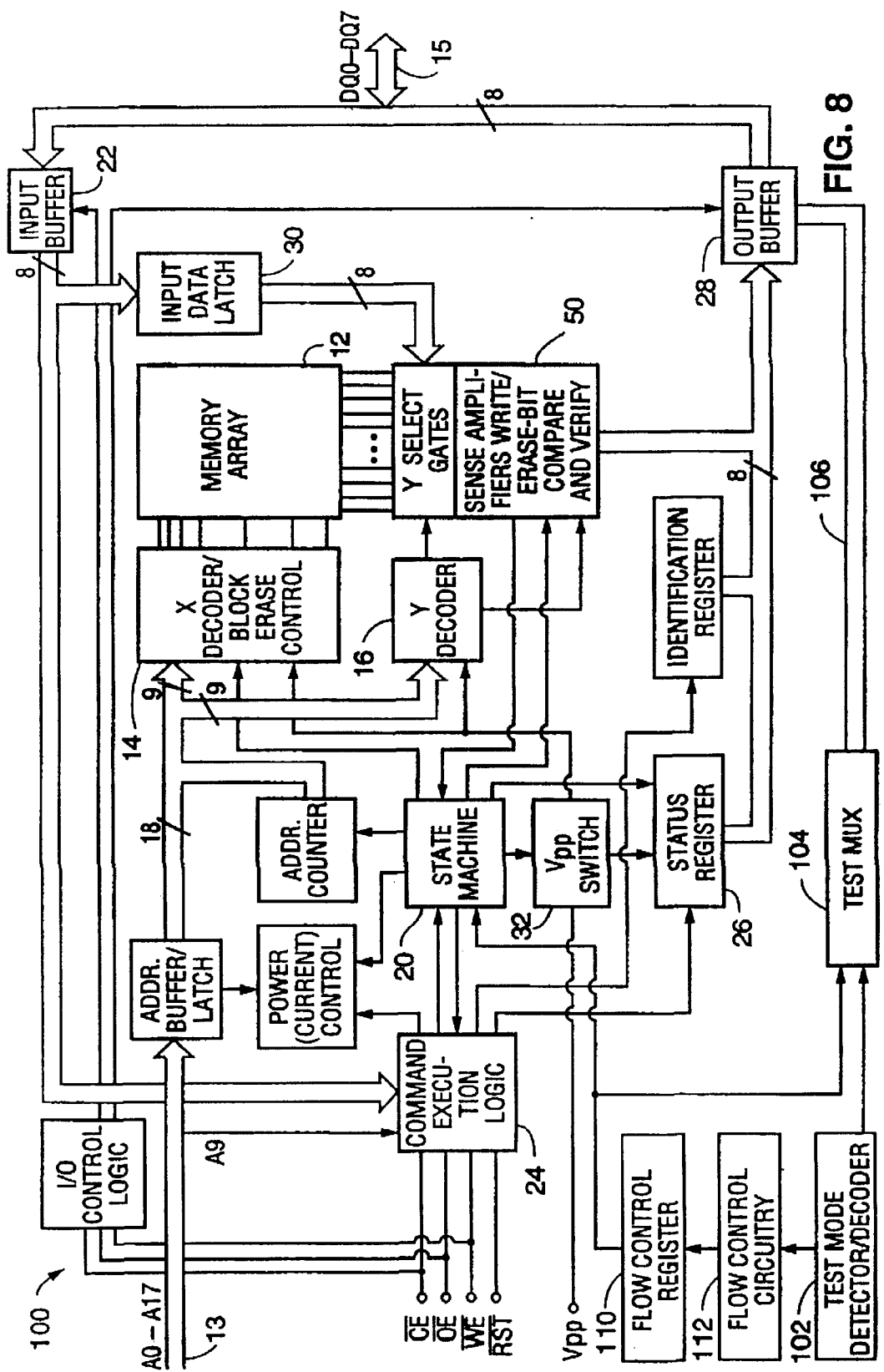
FIG. 8 is a functional block diagram of a memory system which includes a flow control register for altering the process flow of the operations and sub-operations carried out by the system's internal state machine.

FIG. 8 is a functional block diagram of a memory system 100 which includes a flow control register 110 for altering the process flow of the operations and sub-operations carried out by the system's internal state machine 20. It is noted that FIG. 8 is meant to be suggestive of the connections between flow control register 110, its associated circuitry 112 and the rest of the memory system, and that not all interconnections are shown. It is also noted that similar reference numbers in FIGS. 1 and 8 refer to the same signals and components in the two figures.

Figure 1:
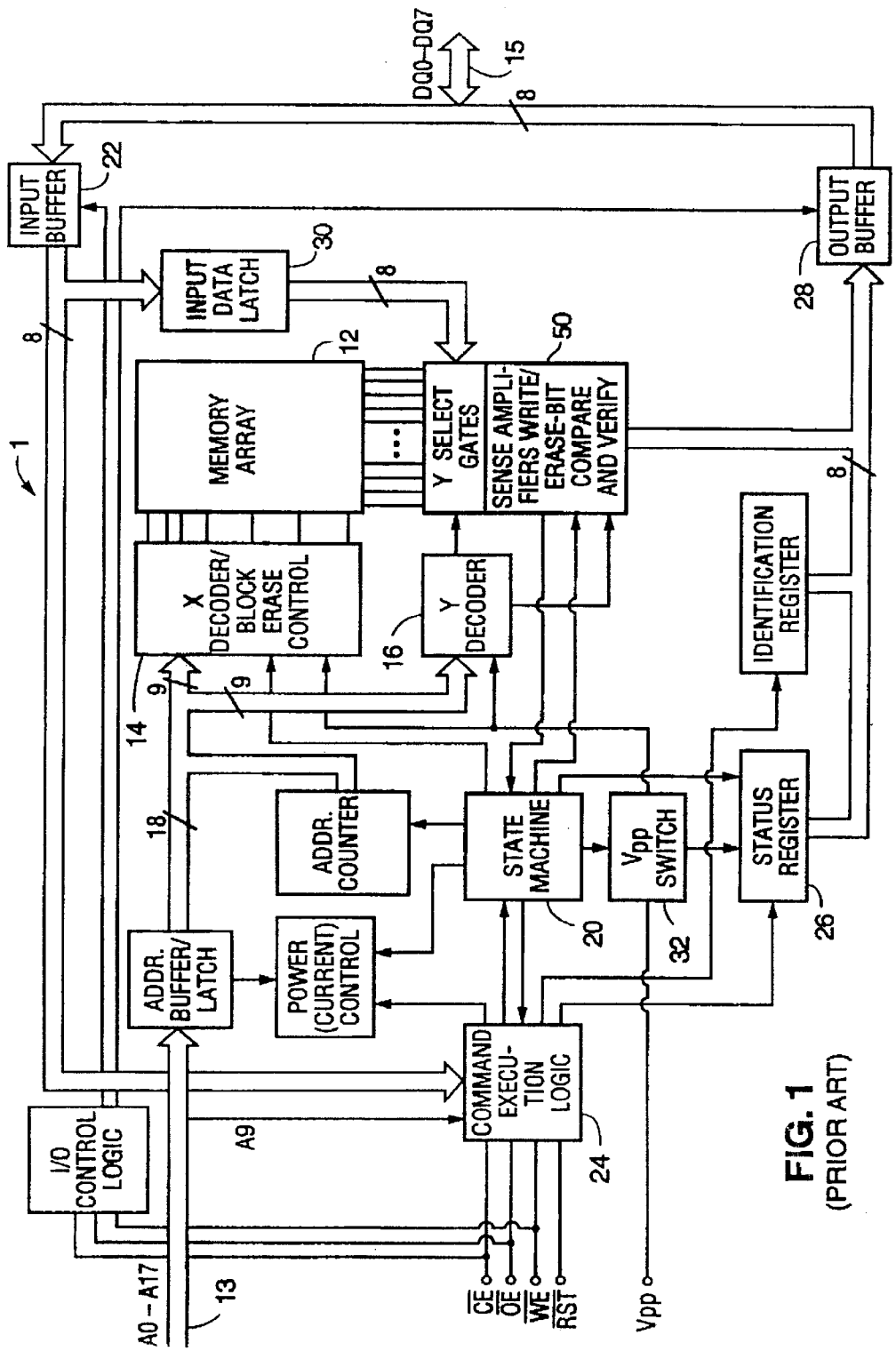
FIG. 1 is a functional block diagram of a conventional non-volatile memory system.

As with the memory system of FIG. 1, the core of memory system 100 is an array 12 of flash memory cells. The individual memory cells (not shown) are accessed by using an eighteen bit address A0–A17, which is input by means of address pins 13. Memory system 100 contains internal state machine (ISM) 20 which controls the data processing operations and sub-operations performed on memory system 100, such as the steps necessary for carrying out programming, reading and erasing operations on the memory cells of array 12. Internal state machine 20 is typically implemented in the form of a set of logic gates whose inputs determine which operations and sub-operations of the memory system are carried out, and in what order those operations occur.

Memory system commands are issued on I/O pins 15, and are transferred to data input buffer 22 and then to command execution logic unit 24. Command execution logic unit 24 receives and interprets the commands which are used to instruct state machine 20 to perform the steps required for erasing array 12 or carrying out another desired operation. Once an operation is completed, state machine 20 updates 8 bit status register 26. The contents of status register 26 is transferred to data output buffer 28, which makes the contents available on data I/O pins 15 of memory system 100.

Memory system 100 includes a test mode detector and decoder 102 used for entry into a test or special mode of operation in which the contents of flow control register 110 may be read or altered, or code signals for use in controlling the operation of the internal timer may be input. Details of the implementation of the detector/decoder 102 were previously described with reference to FIG. 7.

Flow control register 110 contains data used to alter the process flow of the memory system. This is accomplished by instructing internal state machine 20 to include or bypass certain operations or sub-operations, examples of which are shown in FIG. 2. Individual bits within register 110 are used to determine the operations and sub-operations carried out under control of internal state machine 20. For example, by setting a bit of the register, the flow may be modified to include or bypass the pre-program stage (step 200 of FIG. 2) of the complete erase operation. If it is desired to read the contents of control register 110, that data may be routed through test signal switch 104 to output buffer 28 by means of data bus 106, and made available to a system designer.

Figure 9:
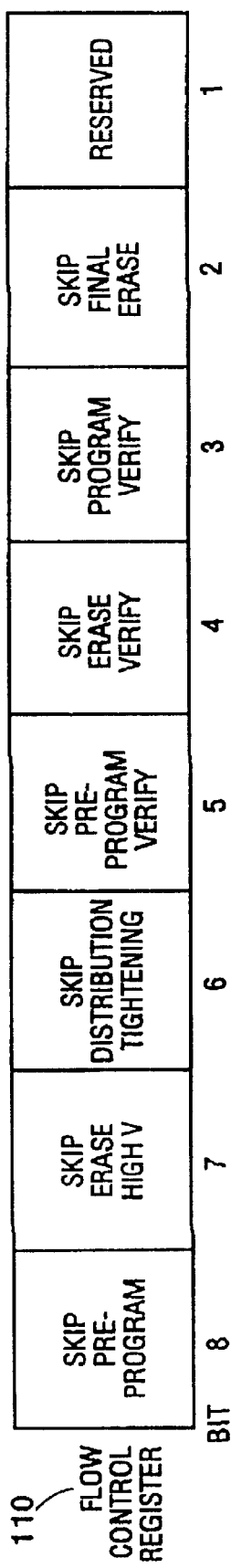
FIG. 9 is a diagram showing the contents of an embodiment of a flow control register of the type shown in FIG. 8.

FIG. 9 is a diagram showing the contents of an embodiment of flow control register 110. As shown in FIG. 9, flow control register 110 is implemented as an 8 bit storage medium. Flow control register 110 may be implemented in the form of a volatile or a non-volatile storage medium, or a combination of the two. If implemented as a volatile medium, register 110 must be re-programmed each time the system is powered up. This can be accomplished by means of flow control register circuitry 112. Flow control register 110 may also be implemented in the form of a storage medium having a volatile and a non-volatile portion. In this case, register 110 would contain non-volatile memory elements which were programmed by circuitry 112 to values corresponding to the desired bit values of the flow control register. When power is applied to the memory system, the contents of the non-volatile portion of the flow control register would be copied to the volatile portion of the flow control register. This section would then control the operation of the state machine. Further details of a method of implementing flow control register 110 can be found in the previously mentioned U.S. patent application Ser. No. 08/508,921, entitled "Memory System Having Programmable Flow Control Register", and in U.S. patent application Ser. No. 08/508,864, entitled, "Non-volatile Data Storage Unit and Method of Controlling Same", filed Jul. 28, 1995, the contents of which is hereby incorporated in full by reference.

The value of each bit of flow control register 110 corresponds to an instruction to internal state machine 20 to include or bypass the indicated operation or sub-operation, i.e., skip program verify, erase verify, etc. Depending on the value of the bits, the indicated stage in the process flow of the memory system is either implemented or bypassed. Combinations of bits (multiple bits) may also be used to instruct the internal state machine to include or bypass certain operations or sub-operations. It is noted that a memory system designer can place as many bits as necessary in register 110 to create as much flexibility in modifying the operation of the memory system as is desired. It is well known to those skilled in the art how to construct a logic circuit which uses the value of the indicated bit(s) of flow control register 110 to alter the operations and sub-operations carried out by an internal state machine.

After instructing the memory system to skip the appropriate stages of the programming or erase operation so that only the high voltage pulse stages are executed (by setting the corresponding bits of flow control register 110), a user of the present invention would then initiate the remaining stages of the programming or erase operation by applying the appropriate commands to the memory system. The preceding operations will cause the memory system to enter the stages of the pre-programming or erase cycle which produce the high voltage pulses and disable control of the pulse duration by the internal timer. The memory system will apply a high voltage pulse for a duration of time determined by the user, who will re-enable control of the pulse duration by the internal timer and terminate the pulse by application of the appropriate code signals (signals 408 and 416 of FIG. 5). The memory system would then exit the high voltage stage and proceed to any stages of operation which have not been skipped.

At the conclusion of these steps the memory system can be subjected to additional tests intended to characterize the effect of the externally controlled pulse on the memory elements. This can be accomplished by entry into different test modes, or by removing the memory system from the test or special mode of operation and conducting the tests.

The sequence of steps described above can be used to facilitate external control of the pulse duration for either the pre-programming, programming, or erase operations. In accordance with the present invention, a test engineer can control the duration of the high voltage programming or erasing pulses by causing a processor to issue the appropriate codes for entering a test or special mode of operation, disabling control of the pulse duration by the internal timer, waiting a desired time interval, and then issuing the appropriate codes for re-enabling control by the internal timer and terminating the pulse. The user can also use the apparatus for entering a test or special mode of operation and flow control register described herein to skip those stages of a programming or erase operation which are not involved in the production of the high voltage pulse. This allows a test engineer to determine the effect of a high voltage pulse of desired duration on the memory cells which are part of the memory system, leading to better characterization of the memory cells.

In the embodiment of the present invention discussed, the user is responsible for entering the test mode and setting the contents of flow control register 110 to the appropriate values for skipping the stages of the programming or erase operation so that only the high voltage pulse stages are executed. However, this function may also be executed automatically upon entry into the test mode and input of the codes which cause external timing signal 322 to transition from low to high. This is accomplished by having Test Mode and Format Check and Decode Logic unit 724 of detector/decoder 102 produce a flow control register control signal (signal 502 of FIGS. 7 and 10) when the external timing mode is entered. It is noted that external timing signal 322 can also be used for this purpose. Flow register control signal 502 (or the inverted signal) serves as a first input to a set of logic gates, with the other input to each gate being the value of one of the bits of flow control register 110. The outputs of the logic gates serve as the control signals which cause a state machine to skip the desired cycles or stages of a programming or complete erase operation.

Figure 10:
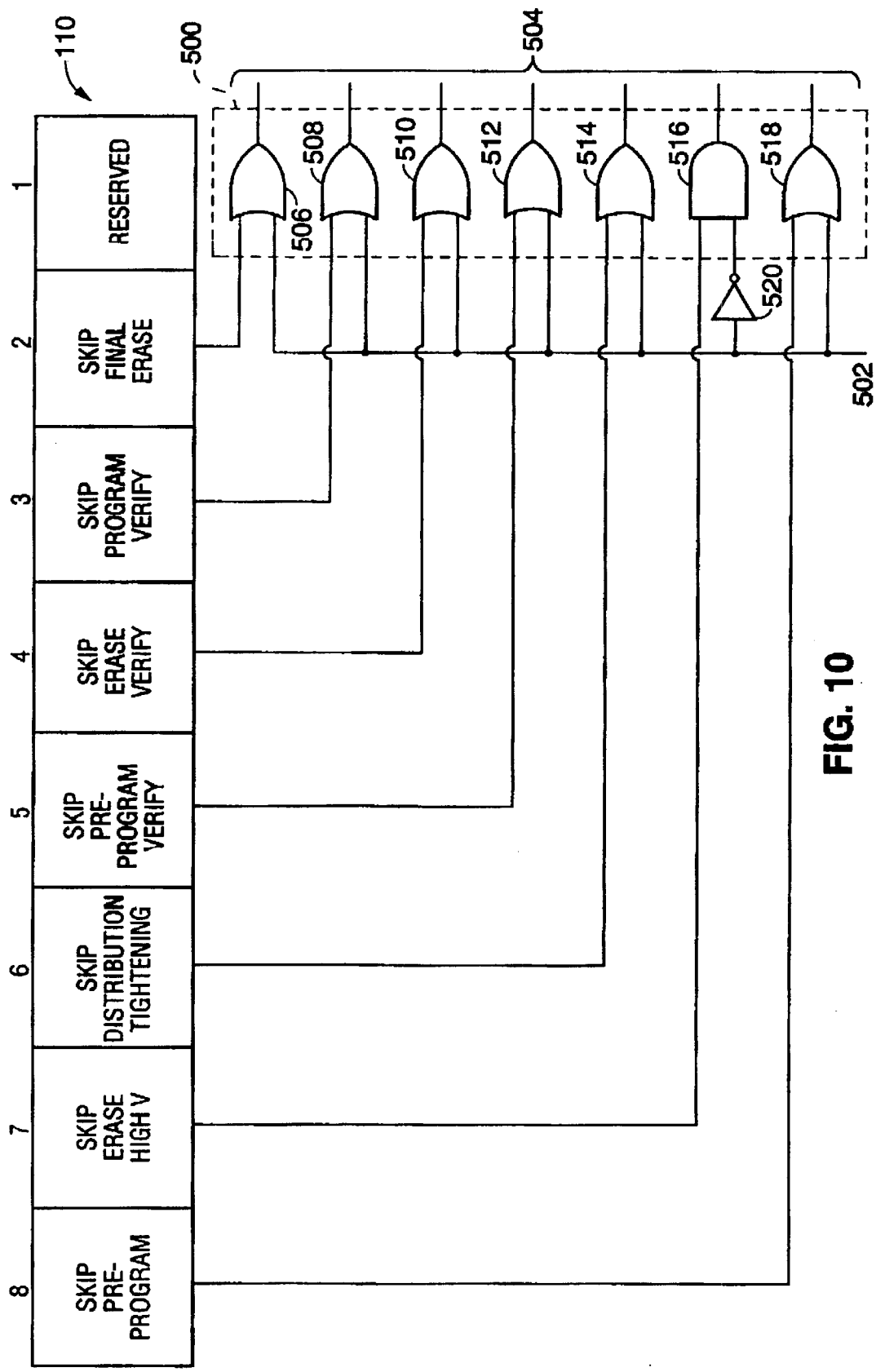
FIG. 10 shows a set of logic gates which can be used in conjunction with a flow control register control signal to automatically provide signals used to cause a state machine to skip the desired cycles or stages of a programming or complete erase operation.

FIG. 10 shows a set of logic gates 500 which can be used in conjunction with flow control register control signal 502 to automatically provide signals 504 used to cause state machine 20 to skip the desired cycles or stages of a programming or complete erase operation. As shown in the figure, logic gates 500 comprise a set of two-input OR gates (gates 506, 508, 510, 512, 514, and 518) and two-input AND gate 516. A first input to each logic gate 500 is a signal representing the contents of each bit of flow control register 110. Thus, one input to each logic gate 500 is a high (logic 1) or low (logic 0) value corresponding to the value of each bit of register 110. The second input to each logic gate 500 is flow control register control signal 502 or an inverted version of that signal. The inverted version is provided by an inverter 520 placed in the signal path between signal 502 and the second input to the appropriate logic gate 500. The internal state machine logic is such that when a control signal 504 produced by a logic gate 500 is high, the cycle or stage corresponding to the input to that logic gate is skipped. For example, if output signal 504 of OR gate 508 is high, then the program verify stage is skipped. With flow control register control signal 502 high, the outputs of each of the OR gates will be high. As a result, the cycles or stages corresponding to the second input to those gates will be skipped. For the purposes of this invention it is desired to skip the pre-programming and distribution tightening cycles, as well as the pre-program verify, erase verify, program verify, and final erase stages of the complete erase operation. Thus, it is desired that the outputs 504 of logic gates 506, 508, 510, 512, 514, and 518 be high. This will cause state machine 20 to skip the desired operations.

Conversely, because of the use of inverter 520, when signal 502 goes high (indicating that the external timing mode has been entered), one input to AND gate 516 is low. Therefore, output signal 504 of AND gate 516 is low and the corresponding cycle or stage (in this case the high voltage erase cycle) is not skipped and instead is implemented. With the arrangement of logic gates shown in FIG. 10, when flow control register signal 502 goes high, the outputs !504 of logic gates 500 will cause state machine 20 to implement the high voltage erase cycle and skip the other cycles and stages of the complete erase operation. The use of logic gates 500 and inverter 520 allows automatic control of the cycles and stages of the complete erase operation which are implemented when the external timing mode is entered.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

I claim:

1. A system, comprising:
    a controller to control a length of a voltage pulse for use in memory operations by providing a selection signal; and
    a memory device including an internal timer having a capability to control the length of the voltage pulse, wherein the internal timer of the memory device disengages from controlling the voltage pulse when the selection signal has a predetermined value so as to allow the controller to control the length of the voltage pulse.

2. A method for selectively switching control of a pulse duration of a voltage signal for programming a memory device, the method comprising:
    providing an external clock signal by a controller;
    providing an external control signal by a timer in a memory device; and
    switching the control of the pulse duration of the voltage signal from the timer in a memory device to the controller when the external timing signal is at a predetermined level in comparison to the internal timing signal.

3. A method for selectively switching control of a length of a pulse of a voltage signal for programming a memory device, the method comprising:
    providing an external timing signal by a controller;
    providing an internal timing signal by a timer in a memory device, wherein the internal timing signal controls a length of the pulse of the voltage signal;
    detecting a first transition in the external timing signal provided by the controller so as to disable the timer from providing the internal timing signal; and
    detecting a second transition in the external timing signal provided by the controller so as to allow the controller to control the length of the pulse of the voltage signal.

4. A system, comprising:
    a controller to control the length of a voltage pulse for use in memory operations by providing an external timing signal, the controller comprising:
        a first flip-flop to provide a first control signal;
        a logic circuit receptive to the first control signal to provide a set signal; and
        a second flip-flop receptive to the set signal to provide the external timing signal; and
    a memory device including an internal timer having the capability to control the length of the voltage pulse, wherein the internal timer of the memory device disengages from controlling the voltage pulse when the external timing signal has a predetermined value so as to allow the controller to control the length of the voltage pulse.

5. A method for selectively switching control of a length of a pulse of a voltage signal for programming a memory device, the method comprising:
    providing an external timing signal by a controller, comprising:
        issuing a first programming signal;
        issuing a second programming signal after a first period of time so as to initiate external control of the length of the pulse of the voltage signal;
        processing the first programming signal and the second programming signal to produce the external timing signal; and
        issuing a third programming signal after a second period of time so as to initiate internal control of the length of the pulse of the voltage signal;
    providing an internal timing signal by a timer in a memory device, wherein the internal timing signal controls the length of the pulse of the voltage signal;
    detecting the first transition in the external timing signal provided by the controller so as to disable the timer from providing the internal timing signal; and
    detecting the second transition in the external timing signal provided by the controller so as to allow the controller to control the length of the pulse of the voltage signal.

6. The method of claim 5, wherein the method does not proceed in the order presented.

* * * * *

UNITED STATES PATENT AND TRADEMARK OFFICE
CERTIFICATE OF CORRECTION

PATENT NO. : 6,381,193 B1
DATED : April 30, 2002
INVENTOR(S) : Roohparvar

It is certified that error appears in the above-identified patent and that said Letters Patent is hereby corrected as shown below:

Column 1,
line 20, after "different" delete ":".

Column 3,
Line 49, after "been" delete ".".

Column 4,
Line 42, after "increment" delete ";".

Column 8,
Line 4, after "flip-flop" delete ")".
Line 44, delete "AN)" and insert -- AND --, therefor.

Column 10,
Line 38, delete "Alo" and insert -- A10 --, therefor.

Column 11,
Line 35, after "the" delete ".".

Column 15,
Line 2, delete "!504" and insert -- 504 --, therefor.
Line 18, after "controller" insert -- receiving a plurality of eternal control signals and operable --, therefor.
Line 33, delete "a timer in a memory device; and" and insert -- the controller; providing an internal timing signal by a timer in a memory device; and --, therefor.
Line 37, delete "external timing" and insert -- external clock --, therefor.
Line 38, delete "timing signal." and insert -- timing signal and the external control signal is activated --, therefor.
Line 43, delete "timing" and insert -- clock --, therefor.
Line 44, after "controller;" insert -- providing an external code signal by the controller;
producing an external timing signal in response to both the eternal clock signal and the external code signal being activated; --.

UNITED STATES PATENT AND TRADEMARK OFFICE
CERTIFICATE OF CORRECTION

PATENT NO. : 6,381,193 B1
DATED : April 30, 2002
INVENTOR(S) : Roohparvar

It is certified that error appears in the above-identified patent and that said Letters Patent is hereby corrected as shown below:

Column 16,
Line 9, after "control signal" insert -- in response to an external first code signal and an external clock signal --.
Line 10, after "a" insert -- first --.
Line 10, after "signal" insert -- and a second code signal --.
Line 11, after "signal" delete "and".
Line 12, after "signal;" insert -- a second logic circuit receptive to the first control signal and a third code signal to provide a reset signal; and --.
Line 12, after "signal" insert -- and the reset signal --.

Signed and Sealed this

First Day of October, 2002

Attest:

JAMES E. ROGAN
Attesting Officer  Director of the United States Patent and Trademark Office